(12) United States Patent
Caffio et al.

(10) Patent No.: US 12,077,436 B2
(45) Date of Patent: Sep. 3, 2024

(54) 3D GRAPHENE

(71) Applicant: INTEGRATED GRAPHENE HOLDING LIMITED, Stirling (GB)

(72) Inventors: Marco Caffio, Doune (GB); Claus Marquordt, Edinburgh (GB)

(73) Assignee: INTEGRATED GRAPHENE HOLDING LIMITED, Stirling (GB)

(*) Notice: Subject to any disclaimer, the term of this patent is extended or adjusted under 35 U.S.C. 154(b) by 272 days.

(21) Appl. No.: 16/641,455

(22) PCT Filed: Aug. 24, 2018

(86) PCT No.: PCT/GB2018/052408
§ 371 (c)(1),
(2) Date: Feb. 24, 2020

(87) PCT Pub. No.: WO2019/038558
PCT Pub. Date: Feb. 28, 2019

(65) Prior Publication Data
US 2020/0180963 A1 Jun. 11, 2020

(30) Foreign Application Priority Data
Aug. 24, 2017 (EP) .................................. 17187835

(51) Int. Cl.
*C01B 32/184* (2017.01)
*B82Y 40/00* (2011.01)
*B82Y 30/00* (2011.01)

(52) U.S. Cl.
CPC ............. *C01B 32/184* (2017.08); *B82Y 30/00* (2013.01); *B82Y 40/00* (2013.01);
(Continued)

(58) Field of Classification Search
CPC ..... C01B 32/184; C01B 32/182; B82Y 30/00; B82Y 40/00; C01P 2004/30; C01P 2006/80
See application file for complete search history.

(56) References Cited

U.S. PATENT DOCUMENTS

| 8,980,217 B2* | 3/2015 | Hiura ................. H01L 21/0237 977/775 |
| 9,005,565 B2* | 4/2015 | Jahangiri-Famenini ..................... B82Y 30/00 427/551 |

(Continued)

FOREIGN PATENT DOCUMENTS

| WO | 2016133571 A2 | 8/2016 |
| WO | 2016181264 A1 | 11/2016 |

OTHER PUBLICATIONS

Yazdi et al., "Direct Creation of Highly Conductive Laser-Induced Graphene Nanocomposites from Polymer Blends," Macromol. Rapid Commun. (2017); 38:1700176—9 pages.
(Continued)

*Primary Examiner* — Michael P Wieczorek
(74) *Attorney, Agent, or Firm* — Saul Ewing LLP

(57) ABSTRACT

A method of forming a 3D graphene material adhered to a surface of a substrate comprises: providing a carbon source on the surface of the substrate; and exposing at least a portion of the carbon source and/or at least a portion of the substrate to a laser beam, thereby converting at least a portion of the carbon source into a 3D graphene material adhered to the surface of the substrate.

38 Claims, 6 Drawing Sheets

(52) U.S. Cl.
CPC ...... *C01P 2002/82* (2013.01); *C01P 2004/04* (2013.01); *C01P 2004/30* (2013.01); *C01P 2006/80* (2013.01)

(56) References Cited

U.S. PATENT DOCUMENTS

| | | | |
|---|---|---|---|
| 2005/0238835 A1* | 10/2005 | Sung | B82Y 30/00 |
| | | | 428/40.1 |
| 2013/0273260 A1* | 10/2013 | Chueh | C01B 32/184 |
| | | | 427/554 |
| 2015/0235847 A1* | 8/2015 | Beasley | H01L 21/288 |
| | | | 427/535 |
| 2017/0062821 A1* | 3/2017 | Tour | H01M 10/054 |
| 2017/0069404 A1 | 3/2017 | Hong et al. | |

OTHER PUBLICATIONS

Peng et al., "Flexible Boron-Doped Laser-Induced Graphene Microsupercapacitors," ACS Nano (2015); 9 (6):5868-5875.
Lin et al., "Laser-induced porous graphene films from commercial polymers," Nature Communications (2014); pp. 1-8.
Lamberti et al., "A Highly Stretchable Supercapacitor Using Laser-Induced Graphene Electrodes onto Elastomeric Substrate," Adv. Energy Mater. (2016); 6:1600050—6 pages.

* cited by examiner

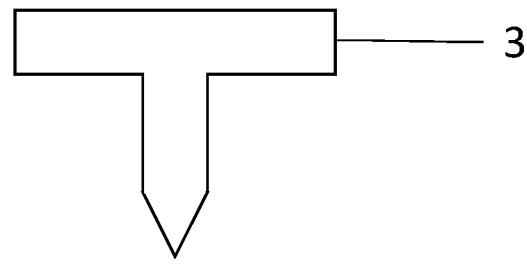
Fig. 1
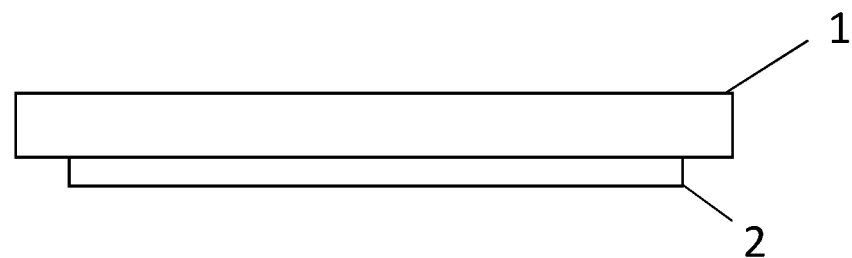
Fig. 2
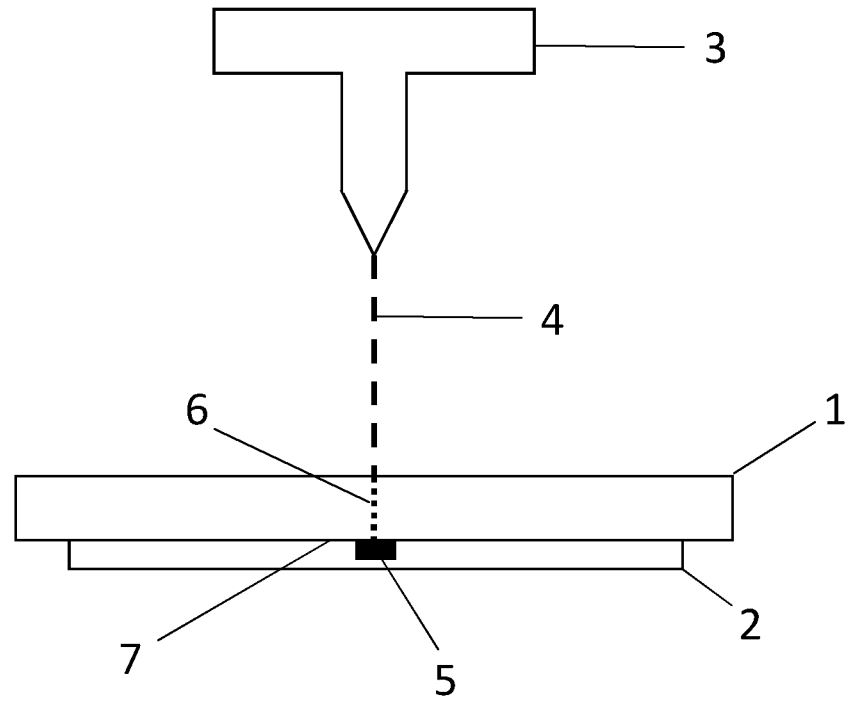

3D GRAPHENE

FIELD OF THE INVENTION

The invention relates to 3D graphene materials, methods of forming 3D graphene materials adhered to substrates, systems comprising 3D graphene materials adhered to substrates, device components comprising 3D graphene materials and methods of manufacturing device components comprising 3D graphene materials.

BACKGROUND TO THE INVENTION

Carbon is known to form many different allotropes. Allotropes such as diamond (in which a face-centred cubic lattice is decorated with a motif of two $sp^3$-hybridised, tetrahedrally-arranged carbon atoms per primitive unit cell) or graphite (in which $sp^2$-hybridised carbon atoms are arranged hexagonally to form planar sheets, adjacent sheets being held together by weak van der Waals interactions), have been known for a long time. Other carbon-based structures, such as graphenes, buckminsterfullerenes, carbon nanotubes, carbon nanoribbons, diamond-like carbons and amorphous carbons, have only recently been discovered.

Graphenes have sparked particular interest due to their unusual electronic, thermal and mechanical properties. One particular graphene material is known as 2D graphene; this is a single, two-dimensional sheet of $sp^2$-bonded carbon atoms arranged on a hexagonal lattice and is essentially one individual layer of graphite. 2D graphene is a zero-gap semiconductor which has a resistivity of approximately $10^{-6}$ $\Omega$cm and an electron mobility of greater than 15000 $cm^2$/Vs at room temperature. 2D graphene is finding applications in electronic devices and, in particular, in nanoscale electronics. However, there are significant challenges in scaling up 2D graphene manufacturing processes which typically require exfoliation of graphite and transfer of exfoliated graphene sheets onto a substrate or complex deposition processes involving physical or chemical vapour deposition combined with post-deposition annealing treatments.

Another graphene material of interest is 3D graphene, also known as porous graphene or laser-induced graphene (LIG). 3D graphene consists of one or more 2D graphene sheets folded back on one another to form a three-dimensional structure rather than a planar sheet. The interatomic bonds in 3D graphene are formed between predominantly $sp^2$-hybridised orbitals and the predominant local coordination of carbon atoms in 3D graphene is similar to that in 2D graphene, with the result that 2D and 3D graphene have similar electronic properties. 3D graphene is therefore a promising material for applications in electronic devices, potentially as a replacement for 2D graphene. In addition, due to its folded structure, 3D graphene is typically porous, with a high specific surface area. This makes 3D graphene particularly suitable for use in energy storage devices such as capacitors (especially supercapacitors) and batteries. 3D graphene could also find applications in sensor components or high-strength composite materials.

The practical applications of 3D graphene, however, are currently limited by difficulties in depositing 3D graphene structures in a controlled way onto substrates. Existing methods for the deposition of 3D graphene structures involve formation of a 3D graphene structure in a polymer sheet, removal of the 3D graphene structure from the polymer sheet, and subsequent transfer of the 3D graphene structure onto the substrate. Such methods are slow and not suited for in-line processing as used, for example, in the manufacture of electronic device components. It is also difficult to control the precise placement of the resultant 3D graphene structure on the substrate, making the production of nanoscale electronic devices problematic.

Accordingly, it would be beneficial to provide methods for the controlled deposition of 3D graphene structures onto a substrate, which are suited for in-line processing.

SUMMARY OF THE INVENTION

A first aspect of the invention provides a method of forming a 3D graphene material adhered (i.e. directly) to a surface of a substrate. The method comprises: providing a carbon source on the surface of the substrate, the carbon source comprising carbon-containing material; and exposing at least a portion of the carbon source and/or at least a portion of the substrate to a laser beam, thereby converting at least a portion of the carbon source into a 3D graphene material adhered (i.e. directly) to the surface of the substrate. The step of converting at least a portion of the carbon source into the 3D graphene material adhered to the surface of the substrate typically comprises concurrently (i.e. at the same time) transferring carbon from the carbon source to the surface of the substrate, forming the 3D graphene material, and adhering the 3D graphene material to the surface of the substrate.

The carbon source is typically a (i.e. preformed) sheet comprising carbon-containing material. Accordingly, the step of converting at least a portion of the carbon source into the 3D graphene material adhered to the surface of the substrate typically comprises concurrently (i.e. at the same time) transferring carbon from the (i.e. preformed) sheet to the surface of the substrate, forming the 3D graphene material, and adhering the 3D graphene material to the surface of the substrate.

In particular, the inventors have found that, by converting at least a portion of a carbon source (such as a (i.e. preformed) sheet comprising carbon-containing material) provided on a surface of a substrate into a 3D graphene material by exposing the at least a portion of the carbon source (e.g. the (i.e. preformed) sheet) to a laser beam, the 3D graphene material formed typically transfers and adheres directly to the surface of the substrate. At least a portion (e.g. a majority, for example all) of the 3D graphene material formed typically remains directly adhered to the surface of the substrate after any unconverted material (i.e. material, which forms part of the carbon source (e.g. the (i.e. preformed) sheet) and which is not converted into the 3D graphene material) is removed from the surface of the substrate. This enables 3D graphene structures to be formed on, and adhered directly to, the surface of the substrate.

Since the parameters of the laser beam (such as laser beam width, laser light wavelength, laser power, and the location at which the laser beam is incident on the carbon source and/or the substrate) can typically be controlled with precision, the location and parameters (e.g. thickness) of the 3D graphene material formed and adhered to the surface of the substrate can be controlled accurately. Accordingly, it is possible to form complex, finely detailed 3D graphene structures in predetermined locations on the surface of the substrate using a surprisingly simple method which is particularly suited to rapid decoration of the surface of the substrate with 3D graphene structures and which can be adapted for in-line processing. Use of a (i.e. preformed) sheet of carbon-containing material rather than, for example, a layer of carbon-containing material deposited onto and bonded directly to the surface of the substrate keeps the method simple and fast and avoids the need, for example, for vacuum conditions, plasma processing steps or complex and expensive deposition apparatus. Crucially, it also allows for unconverted portions of the carbon source to be removed easily without damage to the surface of the substrate or excessive disruption of the 3D graphene material adhered thereto.

It may be that the step of providing the carbon source (e.g. the (i.e. preformed) sheet comprising carbon-containing material) on the surface of the substrate comprises bringing the carbon source (e.g. the (i.e. preformed) sheet comprising carbon-containing material) and the surface of the substrate into (e.g. direct) contact. It may be that the step of providing the carbon source (e.g. the (i.e. preformed) sheet comprising carbon-containing material) on the surface of the substrate comprises placing the carbon source (e.g. the (i.e. preformed) sheet comprising carbon-containing material) (e.g. directly) onto the surface of the substrate. Additionally or alternatively, it may be that the step of providing the carbon source (e.g. the (i.e. preformed) sheet comprising carbon-containing material) on the surface of the substrate comprises placing the substrate (e.g. directly) onto the carbon source (e.g. the (i.e. preformed) sheet comprising carbon-containing material).

The method does not typically comprise depositing the carbon source onto the surface of the substrate using chemical or physical deposition methods, such as physical vapour deposition (PVD), chemical vapour deposition (CVD), molecular beam epitaxy (MBE), sputtering, pulsed laser deposition, cathodic arc deposition, spin coating, dip coating or sol-gel methods. The method does not typically require exposure to a plasma in order to provide the carbon source on the surface of the substrate. Such chemical and physical deposition methods would typically result in the carbon-containing material of the carbon source being directly adhered to (e.g. permanently bonded to) the surface of the substrate. In contrast, in the present invention, the step of providing the carbon source (e.g. the (i.e. preformed) sheet comprising carbon-containing material) on the surface of the substrate typically does not comprise adhering carbon-containing material directly to the surface of the substrate and/or permanently bonding carbon-containing material to the surface of the substrate.

It may be that the step of providing the carbon source (e.g. the (i.e. preformed) sheet comprising carbon-containing material) on the surface of the substrate comprises reversibly (e.g. temporarily) adhering the carbon source (e.g. the (i.e. preformed) sheet comprising carbon-containing material) onto the surface of the substrate using an adhesive. However, it may be that the carbon source (e.g. the (i.e. preformed) sheet comprising carbon-containing material) is not adhered to the surface of the substrate in any way prior to exposure to the laser beam.

The method may be a method of forming a layer of 3D graphene material adhered to the surface of the substrate, the method comprising: providing the carbon source (e.g. the (i.e. preformed) sheet comprising carbon-containing material) on the surface of the substrate; and exposing at least a portion of the carbon source (e.g. the (i.e. preformed) sheet comprising carbon-containing material) and/or at least a portion of the substrate to the laser beam, thereby converting at least a portion of the carbon source (e.g. the (i.e. preformed) sheet comprising carbon-containing material) into a layer of 3D graphene material adhered to the surface of the substrate.

The method may be a method of forming a pattern of 3D graphene material adhered to the surface of the substrate (i.e. patterning the surface of the substrate with 3D graphene material adhered thereto), the method comprising: providing the carbon source (e.g. the (i.e. preformed) sheet comprising carbon-containing material) on the surface of the substrate; and exposing at least a portion of the carbon source (e.g. the (i.e. preformed) sheet comprising carbon-containing material) and/or at least a portion of the substrate to the laser beam, thereby converting at least a portion of the carbon source (e.g. the (i.e. preformed) sheet comprising carbon-containing material) into a 3D graphene material to form a pattern of the 3D graphene material adhered to the surface of the substrate (i.e. patterning the surface of the substrate with the 3D graphene material adhered thereto).

It will be understood that a carbon-containing material is a material comprising carbon. The carbon-containing material (i.e. material comprising carbon) may comprise (e.g. consist of) elemental carbon, one or more mixtures comprising carbon, one or more compounds of carbon, and/or carbon in the form of one or more molecular (e.g. macromolecular) structures. The carbon-containing material typically comprises at least 50% carbon by mass, or more typically at least 75% carbon by mass, or even more typically at least 90% carbon by mass.

The carbon source typically comprises at least one material comprising carbon. The (i.e. preformed) sheet comprising carbon-containing material is typically a (i.e. preformed) sheet comprising at least one material comprising carbon (i.e. a (i.e. preformed) sheet comprising at least some carbon). The carbon source (e.g. the (i.e. preformed) sheet comprising carbon-containing material) typically acts as a source of carbon for transfer onto the surface of the substrate and for formation of the 3D graphene material.

The carbon source (e.g. the (i.e. preformed) sheet comprising carbon-containing material) is typically solid. The carbon source (e.g. the (i.e. preformed) sheet comprising carbon-containing material) is typically a solid body. The carbon source (e.g. the (i.e. preformed) sheet comprising carbon-containing material) may be flexible.

The carbon source (e.g. the (i.e. preformed) sheet comprising carbon-containing material) is not necessarily homogeneous in composition or structure. For example, it may be that the carbon source (e.g. the (i.e. preformed) sheet comprising carbon-containing material) comprises (e.g. consists of) one or more regions of different, or the same, materials. At least one of the one or more regions typically comprises (e.g. is formed from) carbon-containing material. It may be that the carbon source (e.g. the (i.e. preformed) sheet comprising carbon-containing material) comprises (e.g. consists of) one or more one layers of different, or the same, materials. At least one of the layers typically comprises (e.g. is formed from) carbon-containing material.

It may be that the carbon source (e.g. the (i.e. preformed) sheet comprising carbon-containing material) comprises at least 50% carbon by mass, or more typically at least 75% carbon by mass, or even more typically at least 90% carbon by mass.

It may be that the carbon source (e.g. the (i.e. preformed) sheet comprising carbon-containing material) comprises (e.g. is formed from) one or more polymers. It may be that the carbon source (e.g. the (i.e. preformed) sheet comprising carbon-containing material) comprises (e.g. is formed from) one or more of the following materials: polyimides (for example, poly(4,4'-oxydiphenylene-pyromellitimide), otherwise known as Kapton), polyetherimides (PEI), poly(m-ethyl methacrylate) (PMMA) (e.g. spray-coated PMMA), polyurethanes (PU), polyesters, vinyl polymers, carbonized polymers, photoresist polymers, alkyds, urea-formaldehyde.

It may be that the carbon source (e.g. the (i.e. preformed) sheet comprising carbon-containing material) comprises (e.g. is formed from) one or more of the following materials: poly(amic acids) (for example an aryl-containing poly(amic acid)) (for example poly(pyromellitic dianhydride-co-4,4'-oxydianiline), amic acid—otherwise known as polyamic acid); dianhydrides (for example aryl dianhydrides) (for example pyromellitic dianhydride); derivatives of said poly(amic acids); derivatives of said dianhydrides (e.g. derivates of pyromellitic dianhydride).

The skilled person will understand the materials used as the carbon source may themselves undergo conversion to graphene or may be converted to intermediates or prepolymers or other polymers before the graphene is formed.

It may be that the carbon source comprises one or more of the following materials: aromatic materials (e.g. aromatic polymers); heteroaromatic materials (e.g. heteroaromatic polymers); polymers containing aromatic moieties; cyclic materials (e.g. polymers containing cyclic moieties); heterocyclic materials (e.g. polymers containing heterocyclic moieties); heteroaromatic materials (e.g. polymers containing heteroaromatic moieties). Some of the materials which have been found useful for forming graphene when exposed to a laser beam include materials containing one or more of aromatic bonds, heteroaromatic bonds and hetero bonds (e.g. imide bonds).

It may be that the carbon source comprises natural or renewable materials or byproducts from food or other industries. It may be that the carbon source comprises one or more of coffee products, coffee grounds, coffee silver skins or lignin.

It may be that the carbon source (e.g. the (i.e. preformed) sheet comprising carbon-containing material) comprises (e.g. is formed from) one or more carbon-containing materials capable of forming a 3D graphene material on exposure to a laser beam. It may be that the carbon source (e.g. the (i.e. preformed) sheet comprising carbon-containing material) comprises (e.g. is formed from) one or more carbon-containing materials capable of forming a 3D graphene material on heating to a temperature greater than 500° C., or more typically greater than 800° C., or to a temperature between 500° C. and 2000° C., or more typically between 800° C. and 1030° C. It may be that the carbon source (e.g. the (i.e. preformed) sheet comprising carbon-containing material) comprises (e.g. is formed from) one or more carbon-containing materials capable of forming a 3D graphene material on heating to a temperature greater than 500° C., or more typically greater than 800° C., or to a temperature between 500° C. and 2000° C., or more typically between 800° C. and 1030° C., within between 1 ns and 10 μs (i.e. at a rate of between around $5 \times 10^{7}$° C./s and $2 \times 10^{12}$° C./s).

It may be that the carbon source (e.g. the (i.e. preformed) sheet comprising carbon-containing material) comprises (e.g. is formed from) one or more polymers capable of forming a 3D graphene material on exposure to a laser beam. It may be that the carbon source (e.g. the (i.e. preformed) sheet comprising carbon-containing material) comprises (e.g. is formed from) one or more polymers capable of forming a 3D graphene material on heating to a temperature greater than 500° C., or more typically greater than 800° C., or to a temperature between 500° C. and 2000° C., or more typically between 800° C. and 1030° C. It may be that the carbon source (e.g. the (i.e. preformed) sheet comprising carbon-containing material) comprises (e.g. is formed from) one or more polymers capable of forming a 3D graphene material on heating to a temperature greater than 500° C., or more typically greater than 800° C., or to a temperature between 500° C. and 2000° C., or more typically between 800° C. and 1030° C., within between 1 ns and 10 μs (i.e. at a rate of between around $5 \times 10^{7}$° C./s and $2 \times 10^{12}$° C./s).

It may be that the carbon source (e.g. the (i.e. preformed) sheet comprising carbon-containing material) comprises (e.g. is formed from) one or more aromatic polymers. It may be that the carbon source (e.g. the (i.e. preformed) sheet comprising carbon-containing material) comprises (e.g. is formed from) one or more heteroaromatic polymers. It may be that the carbon source (e.g. the (i.e. preformed) sheet comprising carbon-containing material) comprises (e.g. is formed from) one or more polymers containing aromatic moieties. It may be that the carbon source (e.g. the (i.e. preformed) sheet comprising carbon-containing material) comprises (e.g. is formed from) one or more polymers containing cyclic moieties. It may be that the carbon source (e.g. the (i.e. preformed) sheet comprising carbon-containing material) comprises (e.g. is formed from) one or more polymers containing heterocyclic moieties. It may be that the carbon source (e.g. the (i.e. preformed) sheet comprising carbon-containing material) comprises (e.g. is formed from) one or more polymers containing heteroaromatic moieties.

The carbon source (e.g. the (i.e. preformed) sheet comprising carbon-containing material) may be substantially planar. The carbon source (e.g. the (i.e. preformed) sheet comprising carbon-containing material) may be a (e.g. thin) film. The carbon source (e.g. the (i.e. preformed) sheet comprising carbon-containing material) may have a thickness of greater than 5 μm. The carbon source (e.g. the (i.e. preformed) sheet comprising carbon-containing material) may have a thickness of less than 120 μm. The carbon source (e.g. the (i.e. preformed) sheet comprising carbon-containing material) may have a thickness of between 5 μm and 120 μm. The thickness of the carbon source (e.g. the (i.e. preformed) sheet comprising carbon-containing material) may be substantially uniform across the surface of the substrate (i.e. when the carbon source (e.g. the (i.e. preformed) sheet comprising carbon-containing material) is provided thereon). It will be understood that the thickness of the carbon source (e.g. the (i.e. preformed) sheet comprising carbon-containing material) is measured in a direction substantially perpendicular to (e.g. a local portion of) the surface of the substrate on which the carbon source (e.g. the (i.e. preformed) sheet comprising carbon-containing material) is provided.

The method may comprise providing the carbon source (e.g. the (i.e. preformed) sheet comprising carbon-containing material) on one or more portions of the surface of the substrate. The method may comprise providing the carbon source (e.g. the (i.e. preformed) sheet comprising carbon-containing material) on (e.g. across) the whole of the surface of the substrate. The 3D graphene material is typically formed on and adhered to portions of the surface of the substrate on which the carbon source (e.g. the (i.e. preformed) sheet comprising carbon-containing material) was provided (i.e. immediately before exposure to the laser beam).

The carbon source (e.g. the (i.e. preformed) sheet comprising carbon-containing material) may be a polyimide tape (e.g. a Kapton tape) having a first surface and a second surface. It may be that the first surface of the polyimide tape is provided with adhesive (e.g. silicone adhesive). It may be that the step of providing the carbon source (e.g. the (i.e. preformed) sheet comprising carbon-containing material) on the surface of the substrate comprises adhering (e.g. reversibly adhering or temporarily adhering) the first surface of the polyimide tape onto the surface of the substrate by way of the adhesive.

Exposing the at least a portion of the carbon source (e.g. the (i.e. preformed) sheet comprising carbon-containing material) and/or the at least a portion of the substrate to the laser beam typically comprises heating the at least a portion of the carbon source (e.g. the (i.e. preformed) sheet comprising carbon-containing material) and/or the at least a portion of the substrate using the laser beam. Exposing the at least a portion of the carbon source (e.g. the (i.e. preformed) sheet comprising carbon-containing material) and/or the at least a portion of the substrate to the laser beam typically comprises heating the at least a portion of the carbon source (e.g. the (i.e. preformed) sheet comprising carbon-containing material) and/or the at least a portion of the substrate up to a temperature greater than 500° C., or more typically greater than 800° C., or between 500° C. and 2000° C., or more typically between 800° C. and 1030° C., which is typically required in order for conversion to a 3D graphene material to occur.

Exposing the at least a portion of the carbon source (e.g. the (i.e. preformed) sheet comprising carbon-containing material) to the laser beam typically comprises directing the laser beam at the said at least a portion of the carbon source (e.g. the (i.e. preformed) sheet comprising carbon-containing material). Exposing the at least a portion of the carbon source (e.g. the (i.e. preformed) sheet comprising carbon-containing material) to the laser beam may comprise directing the laser beam at at least a portion of a surface of the carbon source (e.g. the (i.e. preformed) sheet comprising carbon-containing material). The surface of the carbon source (e.g. the (i.e. preformed) sheet comprising carbon-containing material) at which the laser beam may be directed is typically a surface of the carbon source (e.g. the (i.e. preformed) sheet comprising carbon-containing material) which faces away from (i.e. is not in contact with) the surface of the substrate on which the carbon source (e.g. the (i.e. preformed) sheet comprising carbon-containing material) is provided. The laser beam may be directed at approximately 90° to the (e.g. at least a portion of the surface of the) carbon source (e.g. the (i.e. preformed) sheet comprising carbon-containing material), that is to say that the angle of incidence of the laser beam on the (e.g. at least a portion of the surface of the) carbon source (e.g. the (i.e. preformed) sheet comprising carbon-containing material) may be approximately 90°.

Exposing the at least a portion of the substrate to the laser beam typically comprises directing the laser beam at the said at least a portion of the substrate. It may be that the substrate comprises first and second opposing surfaces, that the carbon source (e.g. the (i.e. preformed) sheet comprising carbon-containing material) is provided on the first surface of the substrate (i.e. such that the second surface of the substrate faces away from the carbon source), and that exposing the at least a portion of the substrate to the laser beam comprises directing the laser beam at at least a portion of the second surface of the substrate. The laser beam may be directed at approximately 90° to the (e.g. at least a portion of the second surface of the) substrate, that is to say that the angle of incidence of the laser beam on the (e.g. the at least a portion of the second surface of the) substrate may be approximately 90°.

The substrate may comprise (e.g. be formed from) an electrical insulator (e.g. one or more electrically insulating materials). The substrate may comprise (e.g. be formed from) an electrical semiconductor (e.g. one or more electrically semiconducting materials). The substrate may comprise (e.g. be formed from) an electrical conductor (e.g. one or more electrically conducting materials (for example one or more metals, metal alloys or conducting polymers)).

It will be understood that the laser beam is a beam of substantially coherent laser light. The laser beam may be an ultraviolet laser beam. The laser beam may be a visible laser beam. The laser beam may be an infrared laser beam. The laser beam typically has a wavelength (i.e. the laser beam is formed from light having wavelengths) in the range of 235 nm to 27 μm. It may be that the laser beam has a wavelength (i.e. the laser beam is formed from light having wavelengths) of approximately 10.6 μm. The laser beam may be generated by a carbon dioxide ($CO_2$) laser. The laser beam may be substantially monochromatic.

The substrate may be substantially transparent (i.e. optically transparent) to the laser beam, that is to say that the substrate may be substantially transparent (i.e. optically transparent) at the wavelength or wavelengths of the laser beam. For example, the substrate may reflect less than 20% of incident light from the laser beam (i.e. the substrate may have a reflectance lower than 20%) at the wavelength or wavelengths of the laser beam.

It may be that the substrate is not substantially transparent (i.e. optically transparent) to the laser beam, that is to say that the substrate is not substantially transparent (i.e. optically transparent) at the wavelength or wavelengths of the laser beam. The substrate may be substantially opaque (i.e. optically opaque) to the laser beam, that is to say that the substrate may be substantially opaque (i.e. optically opaque) at the wavelength or wavelengths of the laser beam. For example, the substrate may absorb greater than 60% of incident light from the laser beam (i.e. the substrate may have an absorptance greater than 60%) at the wavelength or wavelengths of the laser beam. In embodiments in which the substrate is not substantially transparent or in which the substrate is substantially opaque to the laser beam, the thermal conductance of the substrate is typically high. For example, the substrate typically comprises (e.g. is formed from) one or more materials having thermal conductivities of at least 10 W/mK.

The substrate may comprise (e.g. be formed from) one or more materials which are substantially transparent (i.e. optically transparent) to the laser beam, that is to say that the one or more materials are substantially transparent (i.e. optically transparent) at the wavelength or wavelengths of the laser beam.

The substrate may comprise (e.g. be formed from) one or more of the following: silicon (Si), silicon dioxide ($SiO_2$), gallium nitride (GaN), gallium arsenide (GaAs), zinc oxide (ZnO).

The substrate may be a silicon wafer. The substrate may be a silicon dioxide wafer (sometimes referred to as a silicon oxide wafer). The substrate may be a wafer comprising both silicon and silicon dioxide.

It may be that the substrate is substantially transparent to the laser beam, or the substrate absorbs a substantial proportion of incident light from the laser beam (i.e. thereby heating the substrate) and has a high thermal conductance (i.e. the substrate comprises (e.g. is formed from) one or more materials having thermal conductivities of at least 10 W/mK), and the method comprises exposing at least a portion of the substrate to the laser beam, to thereby convert at least a portion of the carbon source (e.g. the (i.e. preformed) sheet comprising carbon-containing material) into the 3D graphene material adhered to the surface of the substrate. Without wishing to be bound by theory, the inventors believe that, in embodiments in which the substrate is substantially transparent to the laser beam, light is typically transmitted through the substrate to an interface between the substrate and the carbon source (e.g. the (i.e. preformed) sheet comprising carbon-containing material), where the light is absorbed and heats the carbon source (e.g. the (i.e. preformed) sheet comprising carbon-containing materials) locally. Again without wishing to be bound by theory, the inventors believe that, in embodiments in which the substrate absorbs a substantial proportion of incident light from the laser beam (thereby heating the substrate) and the substrate has a high thermal conductance (i.e. the substrate comprises (e.g. is formed from) one or more materials having thermal conductivities of at least 10 W/mK), heat is typically conducted through the substrate to the interface between the substrate and the carbon source (e.g. the (i.e. preformed) sheet comprising carbon-containing material), thereby heating the carbon source (e.g. the (i.e. preformed) sheet comprising carbon-containing material) locally.

Preferably, the carbon source (e.g. the (i.e. preformed) sheet comprising carbon-containing material) is heated rapidly to a temperature greater than 500° C., or more typically greater than 800° C., in order for conversion to a 3D graphene material to occur. It may be that the carbon source (e.g. the (i.e. preformed) sheet comprising carbon-containing material) is heated rapidly to a temperature between 500° C. and 2000° C., or more typically between 800° C. and 1030° C., in order for conversion to a 3D graphene material to occur.

The inventors have found that the carbon-containing material should typically be heated from room temperature (e.g. a temperature of around 20° C.) to a temperature greater than 500° C., or more typically greater than 800° C., or to a temperature between 500° C. and 2000° C., or more typically between 800° C. and 1030° C., within between 1 ns and 10 µs (i.e. at a rate of between around $5 \times 10^{7}$° C./s and $2 \times 10^{12}$° C./s) in order to convert the carbon-containing material to the 3D graphene material. If the carbon-containing material is heated too slowly (e.g. because the substrate reflects too much light and/or has a low thermal conductance (i.e. the substrate comprises (e.g. is formed from) one or more materials having thermal conductivities which are too low)), the carbon-containing material can instead be converted into other materials such as amorphous carbon.

It may be that the substrate comprises (e.g. is formed from) one or more polymers. It may be that the substrate comprises (e.g. is formed from) one or more thermoplastic polymers. The substrate may comprise (e.g. be formed from) one or more of the following materials: polyethylene terephthalates (PET), polypropylenes (PP), cyclic olefin copolymers (COC), poly(methyl methacrylate)s (PMMA), polydimethylsiloxanes (PDMS), polycarbonates (PC), thermoplastic elastomers (TPE), polyolefin blends (TPE-o), elastomeric alloys (TPE-v), thermoplastic polyurethanes (TPU), thermoplastic copolyesters, thermoplastic polyamides (COP), poly(lactic-co-glycolic acid)s (PGLA), polylactides (PLA), acrylonitrile butadiene styrenes (ABS), polyether ether ketones (PEEK), polystyrenes (PS), rubbers.

The substrate may be a flexible substrate.

The method may comprise exposing at least a portion of the carbon source (e.g. the (i.e. preformed) sheet comprising carbon-containing material) to the laser beam, to thereby convert at least a portion of the carbon source (e.g. the (i.e. preformed) sheet comprising carbon-containing material) into the 3D graphene material. In particular, in embodiments in which the substrate comprises (e.g. is formed from) one or more polymers or in which the substrate is a flexible substrate, the method typically comprises exposing at least a portion of the carbon source (e.g. the (i.e. preformed) sheet comprising carbon-containing material) to the laser beam, to thereby convert at least a portion of the carbon source (e.g. the (i.e. preformed) sheet comprising carbon-containing material) into the 3D graphene material.

The substrate may be substantially planar. The surface of the substrate on which the carbon source (e.g. the (i.e. preformed) sheet comprising carbon-containing material) is provided may be substantially flat. The substrate may be a thin film. It may be that the substrate has a thickness of greater than 100 µm. It may be that the substrate has a thickness less than 700 µm.

In embodiments in which the method comprises exposing at least a portion of the substrate to the laser beam, more powerful laser beams are typically required for deposition onto thicker substrates. However, embodiments in which the method comprises exposing at least a portion of the carbon source (e.g. the (i.e. preformed) sheet comprising carbon-containing material) to the laser beam can typically be used to form and adhere 3D graphene material onto any thickness of substrate.

The thickness of the substrate may be substantially uniform in a plane parallel to the surface of the substrate on which the carbon source (e.g. the (i.e. preformed) sheet comprising carbon-containing material) is provided. It will be understood that the thickness of the substrate is measured in a direction substantially perpendicular to the surface of the substrate on which the carbon source (e.g. the (i.e. preformed) sheet comprising carbon-containing material) is provided (i.e. the first surface of the substrate).

The substrate and the carbon source (e.g. the (i.e. preformed) sheet comprising carbon-containing material) are typically formed from one or more different materials, i.e. the substrate and the carbon source (e.g. the (i.e. preformed) sheet comprising carbon-containing material) do not typically have the same structure and/or composition.

It may be that the substrate is not a graphene-philic substrate. It may be that the surface of the substrate on which 3D graphene is formed is not a graphene-philic substrate. It is not typically necessary to provide (e.g. deposit) a graphene-philic layer on the surface of the substrate prior to providing the carbon source (e.g. the (i.e. preformed) sheet comprising carbon-containing material) on the surface of the substrate. It will be understood that a graphene-philic substrate, surface or layer is a substrate, surface or layer having particular physical and/or chemical properties which promote the formation of graphene materials (e.g. 2D graphene and/or 3D graphene materials) thereupon when the carbon source (e.g. the (i.e. preformed) sheet comprising carbon-containing material) is exposed to the laser beam. The method does not typically require use of a catalyst to promote the formation of the 3D graphene material.

It will be understood that the 3D graphene material is a material comprising at least some 3D graphene. The 3D graphene material may comprise predominantly 3D graphene. The 3D graphene material may be 3D graphene. It will also be understood that the term '3D graphene' (otherwise known as 'porous graphene' or 'laser-induced graphene') refers to a form of graphene material consisting of one or more 2D graphene sheets folded back on one another to form a three-dimensional structure rather than a planar sheet. 3D graphene lacks the regular AB stacking of planar graphene sheets found in graphite or multilayer 2D graphene. The 3D graphene material is typically porous. The individual folded carbon sheets which form 3D graphene may comprise lattice defects and/or bent carbon-carbon bonds. Carbon atoms in the individual folded carbon sheets may be arranged (i.e. predominantly) on a hexagonal lattice. The carbon atoms may also be arranged to form pentagon-heptagon pairs. The interatomic bonds in 3D graphene are typically formed between predominantly $sp^2$-hybridised carbon orbitals.

The 3D graphene material may comprise (e.g. be) functionalised 3D graphene. The 3D graphene material may comprise one or more dopants, that is to say the 3D graphene material may comprise (e.g. be) doped 3D graphene. The 3D graphene material may comprise one or more nanoparticles (e.g. metal nanoparticles).

The 3D graphene material may comprise carbon at an atomic percentage of at least 96%.

The 3D graphene material may comprise oxygen at an atomic percentage of less than 3%. The 3D graphene material may comprise oxygen at an atomic percentage of less than 1.2%. If the method is carried out in vacuum conditions, the 3D graphene material formed may comprise oxygen at an atomic percentage of less than 0.5%.

The 3D graphene material may comprise nitrogen at an atomic percentage of less than 3%. The 3D graphene material may comprise nitrogen at an atomic percentage of less than 1.2%. If the method is carried out in vacuum conditions, the 3D graphene material formed may comprise nitrogen at an atomic percentage of less than 0.5%.

The laser beam may have a beam width (e.g. a FWHM (full width at half maximum) beam width) of between 1 μm and 100 μm. The laser beam may have a beam width (e.g. a FWHM beam width) of approximately 50 μm. The laser beam may have a substantially circular cross-section (i.e. in a direction perpendicular to the beam axis). The laser beam may have a power of between 0.05 W and 120 W. The laser beam may have a power of between 1.2 W and 24 W. It may be that the laser beam has a power of between 10 W and 18 W (for example, approximately 14 W) and the method comprises exposing at least a portion of the substrate to the laser beam. It may be that the laser beam has a power of between 2 W and 10 W and the method comprises exposing at least a portion of the carbon source (e.g. the (i.e. preformed) sheet comprising carbon-containing material) to the laser beam.

The method may comprise scanning the laser beam across the carbon source (e.g. the (i.e. preformed) sheet comprising carbon-containing material) and/or the substrate. The method may comprise scanning the laser beam across the carbon source (e.g. the (i.e. preformed) sheet comprising carbon-containing material) and/or the substrate at a scan rate of between 1.7 mm/s and 3550 mm/s, or more typically between 35 mm/s and 350 mm/s.

The laser beam may be a pulsed laser beam. Alternatively, the laser beam may be a continuous wave laser beam.

The laser beam may be pulsed at a frequency (i.e. pulse repetition rate (PRP)) of less than 1 GHz (i.e. with a period greater than 1 ns). The laser beam may be pulsed with a pulse duration between 80 as and 1 ms, or more typically between 1 μs and 50 μs. The laser beam may be pulsed with a pulse duration of approximately 14 μs.

The method may comprise scanning the laser beam across the carbon source (e.g. the (i.e. preformed) sheet comprising carbon-containing material) and/or the substrate such that the number of pulses per inch (PPI) is between 100 and 10000.

The method may be carried out at atmospheric pressure. The method does not typically require pressurised or vacuum conditions.

The method may be carried out at room temperature. It will be understood, however, that the temperature of the carbon source (e.g. the (i.e. preformed) sheet comprising carbon-containing material) and/or the substrate typically fluctuates during the step of exposing the at least a portion of the carbon source (e.g. the (i.e. preformed) sheet comprising carbon-containing material) and/or the at least a portion of the substrate to the laser beam. Indeed, the inventors have found that the carbon source (e.g. the (i.e. preformed) sheet comprising carbon-containing material) should locally reach between 500° C. and 2000° C., or more typically between 800° C. and 1030° C. in order for conversion to a 3D graphene material to occur. Nevertheless, the method does not typically require heating the substrate and/or the carbon source (e.g. the (i.e. preformed) sheet comprising carbon-containing material) other than by exposure to the laser beam.

The method may comprise removing one or more portions of the carbon source (e.g. the (i.e. preformed) sheet comprising carbon-containing material) which have not converted to the 3D graphene material (i.e. unconverted portions of the carbon source) from the surface of the substrate. The unconverted portions are typically portions of the said carbon source (e.g. the (i.e. preformed) sheet comprising carbon-containing material) which have not been (i.e. directly) exposed to the laser beam (i.e. portions at which the laser beam was not directed or portions of the carbon source (e.g. the (i.e. preformed) sheet comprising carbon-containing material) which were not immediately adjacent to portions of the substrate which have been (i.e. directly) exposed to the laser beam). The 3D graphene material typically remains adhered to the surface of the substrate when the unconverted portions are removed.

The method may comprise introducing one or more dopants into the 3D graphene material formed on the substrate, to thereby form a doped 3D graphene material. The one or more dopants may comprise boron and/or nitrogen. The one or more dopants may be introduced into the 3D graphene material using ion implantation (such as plasma-immersion ion implantation), plasma doping and/or plasma activation methods.

It may be that a fluid (e.g. a high viscosity fluid) is provided intermediate the carbon source and the substrate before exposure to the laser beam.

The fluid may optionally be a liquid with viscosity between 1 and 250,000 cPs, or between 10 and 100,000 cPs, or between 50 and 10,000 cPs, or between 50 and 1,000 cPs, or between 100 and 750 cPs, or between 200 and 600 cPs, or between 300 and 500 cPs, or between 370 and 430 cPs. The viscosity may optionally be as measured at 25° C. using standard text method ASTM D7945-16.

The (e.g. high viscosity) fluid may be a surfactant, for example a polysorbate, for example polysorbate 20, polysorbate 80, Tween 20, Tween 80, or Sodium dodecyl sulfate, Lauryl dimethyl amine oxide, a polyethoxylated alcohol, polyoxyethylene sorbitan, octoxynol (Triton X100™), or Polyoxyl 10 lauryl ether, for example.

Without wishing to be bound by theory, the presence of a fluid (e.g. a high viscosity fluid) intermediate the carbon source and the substrate may enhance the formation and adherence to the substrate of the graphene because this facilitates the grains coalescing into larger assemblies and/or thicker layers. It may prevent graphene flakes detaching from the surface of the carbon source (e.g. polyimide)

The substrate may comprise (e.g. be formed from) one or more metal. In such cases a metal carbide may be formed at the interface, and may act as an adhesion layer. For example the metal may be, or may comprise, aluminium, copper or gold or other metals. The substrate may comprise (e.g. be formed from) oxides, nitrides or arsenides of said metals A second aspect of the invention provides use of the method of the first aspect of the invention in the manufacture of one or more device components. The one or more device components may be one or more electronic device components (i.e. components for use in electronic devices). The one or more device components may be one or more integrated circuit components. For example, the one or more device components may be one or more transistors, electrodes or capacitors. The one or more device components may be one or more sensor components (i.e. components for use in sensors). The one or more device components may be one or more piezoelectric device components. The one or more device components may be one or more energy storage components. For example, the one or more device components may be one or more battery components (e.g. batteries), fuel cell components (e.g. fuel cells), biofuel cell components (e.g. biofuel cells), capacitors or supercapacitors.

A third aspect of the invention provides a system comprising a 3D graphene material adhered to a substrate, the 3D graphene material having been formed by the method according to the first aspect of the invention.

A fourth aspect of the invention provides a device component (for example, an electronic device component, integrated circuit component, sensor component, piezoelectric device component and/or energy storage component) manufactured by the method according to the second aspect of the invention and/or incorporating the system according to the third aspect of the invention.

A fifth aspect of the invention provides a 3D graphene material comprising oxygen at an atomic percentage of less than 3%. It may be that the 3D graphene material comprises oxygen at an atomic percentage of less than 1.5%. It may be that the 3D graphene material comprises oxygen at an atomic percentage of less than 1.2%. It may be that the 3D graphene material is provided on (e.g. is adhered to) a substrate.

A sixth aspect of the invention provides a 3D graphene material comprising nitrogen at an atomic percentage of less than 3%. It may be that the 3D graphene material comprises nitrogen at an atomic percentage of less than 2.8%. It may be that the 3D graphene material comprises nitrogen at an atomic percentage of less than 1.5%. It may be that the 3D graphene material is provided on (e.g. is adhered to) a substrate.

A seventh aspect of the invention provides a method of forming a graphene material adhered (i.e. directly) to a surface of a substrate. The method comprises: providing a carbon source on the surface of the substrate, the carbon source comprising carbon-containing material; and exposing at least a portion of the carbon source and/or at least a portion of the substrate to a laser beam, thereby converting at least a portion of the carbon source into a graphene material adhered (i.e. directly) to the surface of the substrate. The step of converting at least a portion of the carbon source into the graphene material adhered to the surface of the substrate typically comprises concurrently (i.e. at the same time) transferring carbon from the carbon source to the surface of the substrate, forming the graphene material, and adhering the graphene material to the surface of the substrate. The carbon source is typically a (i.e. preformed) sheet comprising carbon-containing material. Accordingly, the step of converting at least a portion of the carbon source into the graphene material adhered to the surface of the substrate typically comprises concurrently (i.e. at the same time) transferring carbon from the (i.e. preformed) sheet to the surface of the substrate, forming the graphene material, and adhering the graphene material to the surface of the substrate.

The graphene material may comprise (e.g. be) 2D graphene. The graphene material may comprise (e.g. be) 3D graphene. The graphene material may comprise (e.g. be) functionalised graphene. The graphene material may comprise one or more dopants. The graphene material may comprise one or more nanoparticles (e.g. metal nanoparticles). The graphene material may comprise carbon at an atomic percentage of at least 96%. The graphene material may comprise oxygen at an atomic percentage of less than 3%, or less than 1.2%, or less than 0.5%. The graphene material may comprise nitrogen at an atomic percentage of less than 3%, or less than 1.2%, or less than 0.5%.

Optional and preferred features of any one aspect of the invention may be features of any other aspect of the invention.

DESCRIPTION OF THE DRAWINGS

An example embodiment of the present invention will now be illustrated with reference to the following Figures in which:

FIG. 1 shows a polyimide film in contact with a silicon substrate, located beneath a $CO_2$ pulsed laser engraving system, prior to laser treatment;

FIG. 2 shows the polyimide film and silicon substrate of FIG. 1 during laser treatment;

DETAILED DESCRIPTION OF EXAMPLE EMBODIMENTS

First Example Embodiment 3D graphene was deposited on and adhered to a silicon substrate by the method set out below and as illustrated in FIGS. 1 to 4. A 600 μm thick silicon substrate 1 was placed directly on top of a 120 μm thick polyimide film, as shown in FIG. 1.

A $CO_2$ infrared pulsed laser engraving and cutting system (the Trotec Speedy 400 flexx) 3 was used to direct a laser beam 4 at a surface of the substrate facing away from the polyimide film, as shown in FIG. 2. The laser system was tuned to emit light at a wavelength of 10.6 µm, with a beam size of 50 µm, a pulse duration of 14 µs and a power of 14.14 W. The laser beam was scanned across the surface of the substrate at a scan rate of 284 mm/s. The process was carried out at room temperature and at atmospheric pressure.

As shown in FIG. 2, a portion 5 of the polyimide film, immediately adjacent to the region of the substrate at which the laser beam was directed, was converted into 3D graphene. Without intending to be bound by theory, the inventors believe that heat (and/or light) generated by the laser was transmitted through the substrate (indicated by dashed line 6 in FIG. 2) to the interface 7 between the substrate and the polyimide film, such that the temperature of the polyimide film was raised locally to between 800° C. and 1030° C., at which temperature the polyimide film converted to 3D graphene.

The polyimide film was converted to 3D graphene at the interface 7. The 3D graphene formed did not extend through the full thickness of the polyimide film.

Figure 3:
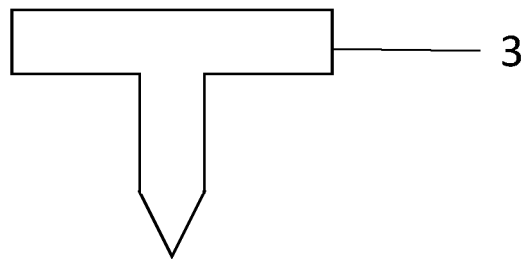
FIG. 3 shows the polyimide film and silicon substrate of FIG. 1 following laser treatment.
Figure 3:
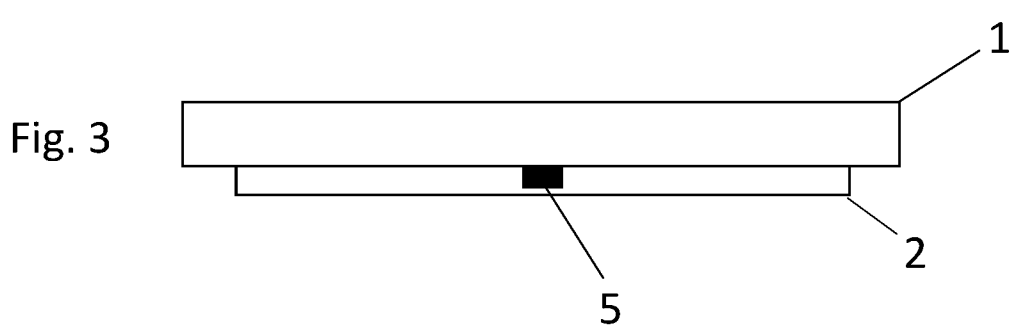
Figure 4:
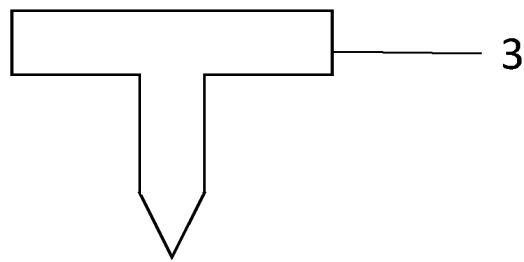
FIG. 4 shows the silicon substrate of FIG. 1 after removal of the polyimide film following laser treatment.
Figure 4:
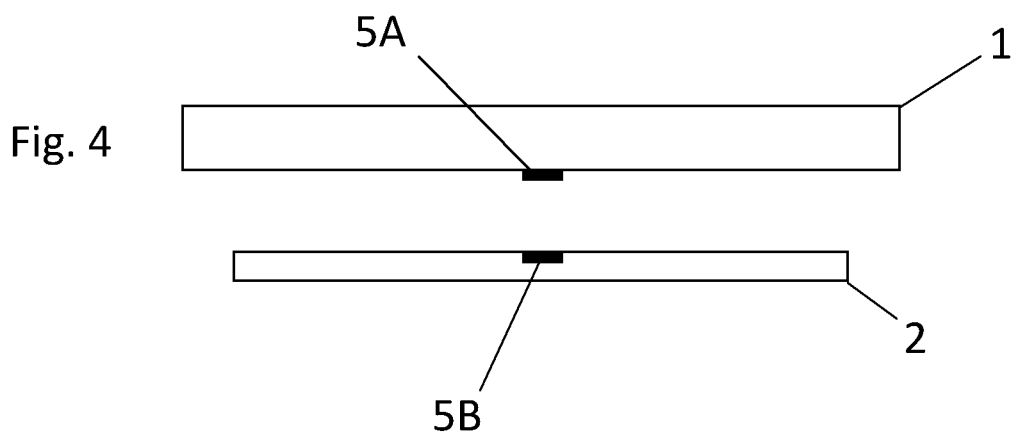

The laser beam was switched off (FIG. 3) and unconverted portions of the polyimide film were removed from the substrate (FIG. 4). The inventors found that a portion 5A of the 3D graphene which had been formed from the polyimide film remained adhered to the substrate when the unconverted portions of the polyimide film were removed. The remainder 5B of the 3D graphene remained adhered to the polyimide film.

On further inspection, the inventors found that the structure of the silicon substrate at the interface between the substrate and the 3D graphene had been modified. There are indications that a thin layer of what is believed to be silicon carbide (SiC) or silicon oxycarbide ($SiO_xC_y$) had been formed at the interface between the silicon substrate and the 3D graphene, bonding the 3D graphene to the silicon substrate.

The 3D graphene deposited on the silicon substrate was characterised using Raman spectroscopy and X-ray photoelectron spectroscopy (XPS).

Figure 5:
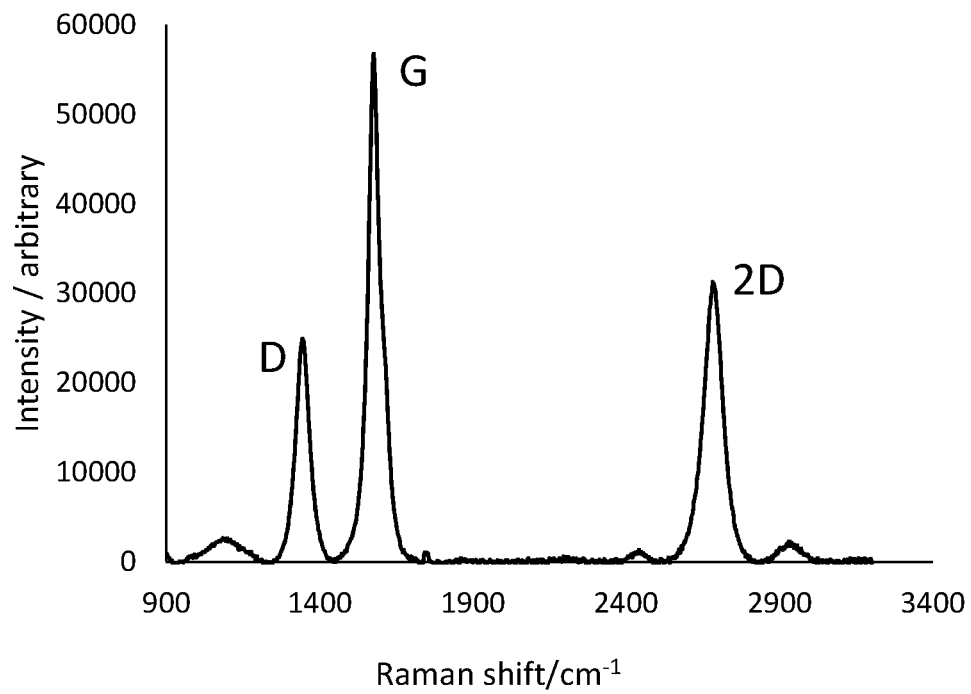
FIG. 5 shows a Raman spectrum measured for 3D graphene deposited on a silicon substrate using the method shown in FIGS. 1 to 4.

The Raman spectrum shown in FIG. 5 has three principal peaks characteristic of 3D graphene. In particular, the D peak at 1344 $cm^{-1}$ is characteristic of the presence of lattice defects and bent $sp^2$ carbon-carbon bonds and the G peak at 1577 $cm^{-1}$ is characteristic of $sp^2$ carbon hybridisation, with the presence of distorted six-fold carbon rings, or carbon rings of other orders, and with an upper limit of 5% $sp^3$ carbon hybridisation. The 2D peak at 2685 $cm^{-1}$ is characteristic of second order transitions in the 3D graphene and the absence of a doublet structure here indicates a lack of planar AB stacking which would be found in multilayer 2D graphene or graphite. Fitting the 2D peak with a single Lorentzian peak (having a full width at half maximum of 67 $cm^{-1}$) centred at 2685 $cm^{-1}$ indicates that there are only one, or a few, graphene-like layers present in the 3D graphene formed. Analysis of the D/G peak ratio (0.4) indicates that the average grain size (i.e. the 3D graphene crystallite size) was 43.6 nm.

Figure 6:
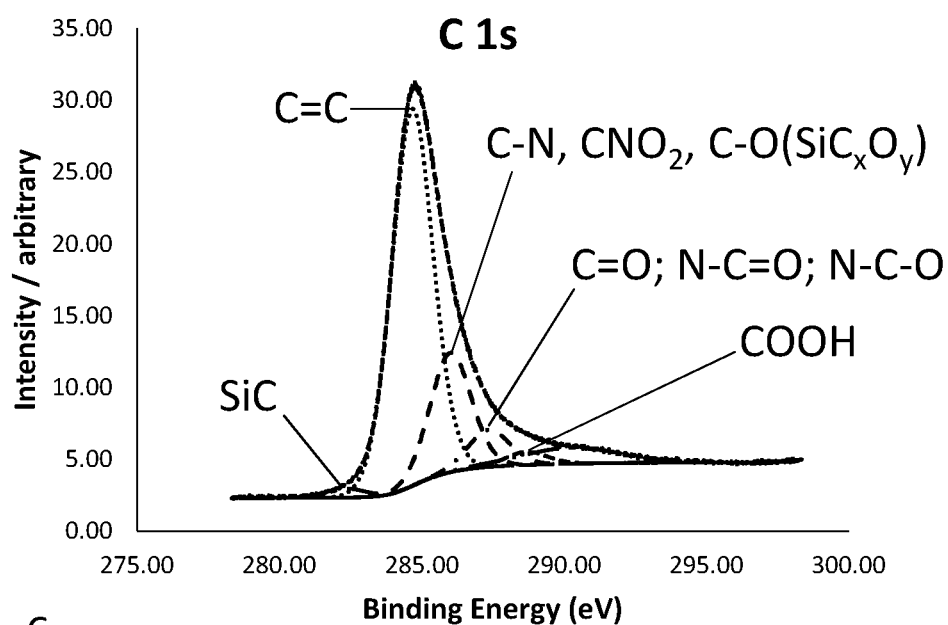
FIG. 6 shows an X-ray photoelectron spectrum for 3D graphene deposited on a silicon substrate using the method shown in FIGS. 1 to 4.

The XPS spectrum shown in FIG. 6 has a dominant peak at 284.5 eV, which indicates the presence of $sp^2$ carbon-carbon bonds. The peaks associated with carbon-nitrogen single and double bonds, as well as carbon-oxygen single and double bonds, are small. The XPS analysis indicates that 96% of the atoms present are carbon atoms, while only 2.8% of the atoms present are nitrogen atoms and only 1.2% of the atoms present are oxygen atoms.

The 3D graphene formed by this method was found to be between 5 µm and 20 µm thick. The 3D graphene was found to be porous with an average pore size of between 4 nm and 10 nm.

The method according to this first example embodiment of the invention has also been used to form 3D graphene on a silicon dioxide wafer (consisting of a 300 nm thick layer of silicon dioxide on top of a silicon wafer) with similar results. 3D graphene materials deposited using the method according to this first example embodiment have been doped with boron and with nitrogen using standard doping methods known in the field, including plasma doping.

Figure 7:
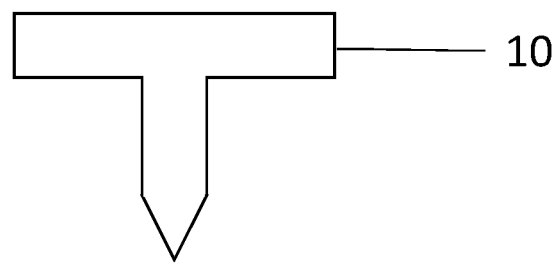
FIG. 7 shows a polyimide film in contact with a polystyrene substrate, located beneath a $CO_2$ pulsed laser engraving system, prior to laser treatment.
Figure 7:
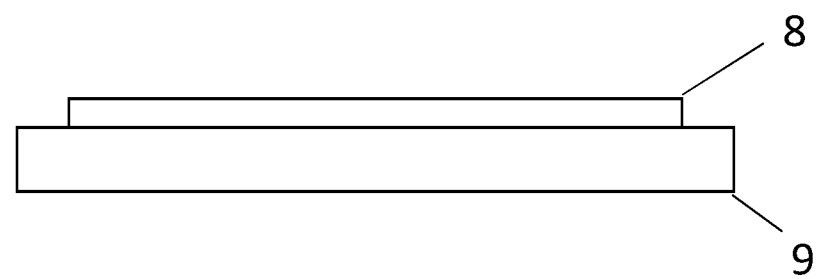

Second Example Embodiment 3D graphene was deposited on and adhered to a polystyrene substrate by the method set out below and as illustrated in FIGS. 7 to 10. A 25 µm thick polyimide film 8 was placed directly on top of a 600 µm thick polystyrene substrate 9, as shown in FIG. 7.

Figure 8:
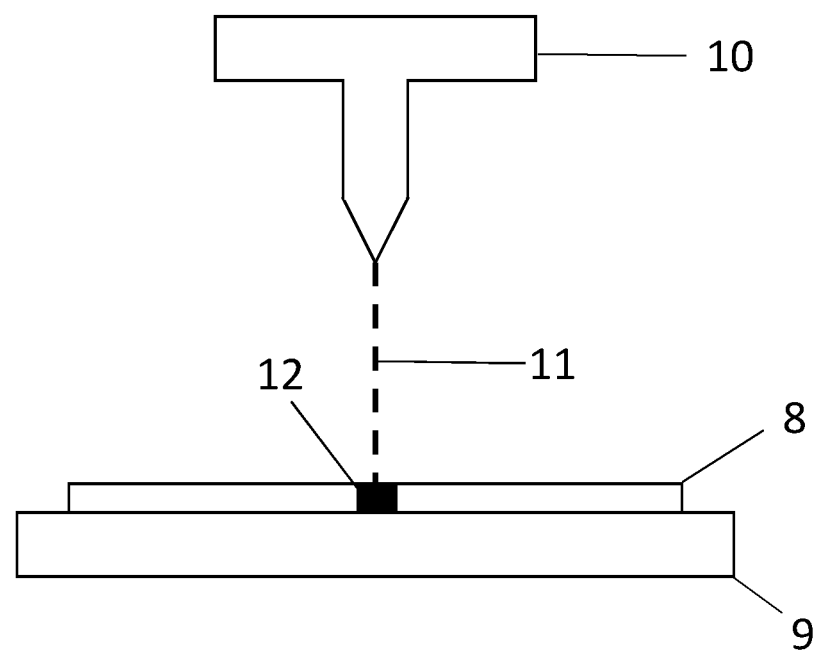
FIG. 8 shows the polyimide film and polystyrene substrate of FIG. 7 during laser treatment.
Figure 9:
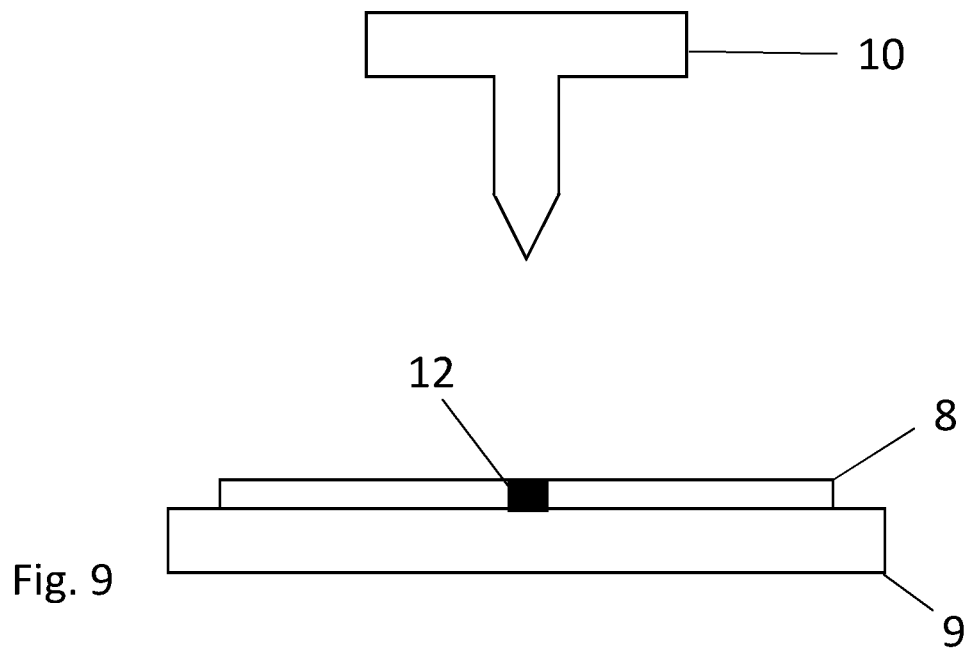
FIG. 9 shows the polyimide film and polystyrene substrate of FIG. 7 following laser treatment.

A $CO_2$ infrared pulsed laser engraving and cutting system (the Trotec Speedy 400 flexx) 10 was used to direct a laser beam 11 at a surface of the polyimide film 8 facing away from the substrate 9, as shown in FIG. 8. The laser system was tuned to emit light at a wavelength of 10.6 µm, with a beam size of 50 µm, a pulse duration of 14 µs and a power of 6 W. The laser beam was scanned across the surface of the substrate at a scan rate of 87.5 mm/s. The process was carried out at room temperature and at atmospheric pressure.

As shown in FIG. 8, a portion 12 of the polyimide film, at which the laser beam was directed, was converted into 3D graphene. The full thickness of the polyimide film was converted into 3D graphene.

Figure 10:
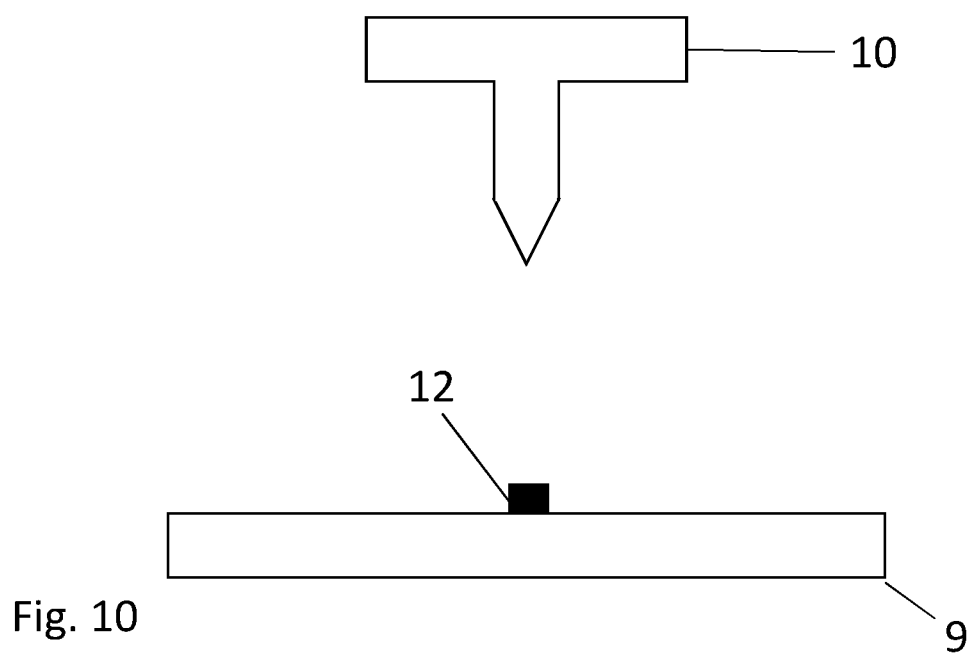
FIG. 10 shows the polystyrene substrate of FIG. 7 after removal of the polyimide film following laser treatment.

The laser beam was switched off (FIG. 9) and unconverted portions of the polyimide film were removed from the substrate (FIG. 10). The inventors found that the 3D graphene which had been formed from the polyimide film remained adhered to the substrate when the unconverted portions of the polyimide film were removed. On further inspection, the inventors found that the structure of the polystyrene substrate at the interface between the substrate and the 3D graphene had been modified. There are indications that a thin layer of the polystyrene substrate at the interface had melted and resolidified, bonding the 3D graphene to the substrate.

The 3D graphene deposited on the polystyrene substrate was characterised using Raman spectroscopy.

Figure 11:
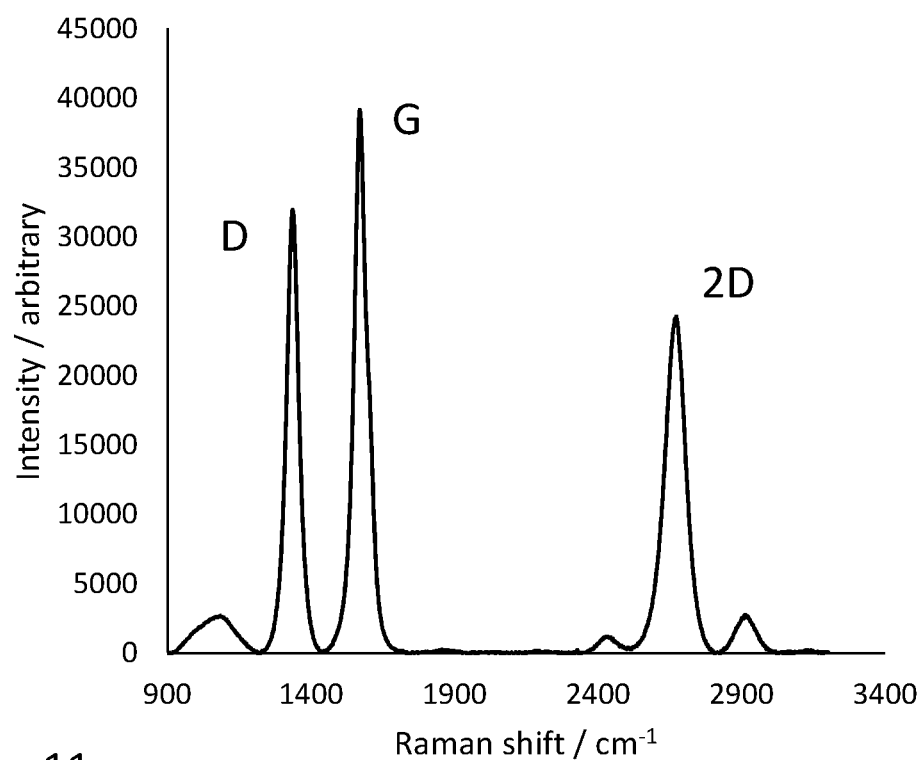
FIG. 11 shows a Raman spectrum measured for 3D graphene deposited on a polystyrene substrate using the method shown in FIGS. 7 to 10.

The Raman spectrum shown in FIG. 11 has three principal peaks characteristic of 3D graphene. In particular, the D peak at 1340 $cm^{-1}$ is characteristic of the presence of lattice defects and bent $sp^2$ carbon-carbon bonds and the G peak at 1577 $cm^{-1}$ is characteristic of $sp^2$ carbon hybridisation, with the presence of distorted six-fold carbon rings, or carbon rings of other orders, and with an upper limit of 5% $sp^\alpha$ carbon hybridisation. The 2D peak at 2680 $cm^{-1}$ is characteristic of second order transitions in the 3D graphene and the absence of a doublet structure here indicates a lack of planar AB stacking which would be found in multilayer 2D graphene or graphite. Fitting the 2D peak with a single Lorentzian peak (having a full width at half maximum of 61 $cm^{-1}$) centred at 2680 $cm^{-1}$ indicates that there are only one, or a few, graphene-like layers present in the 3D graphene formed. Analysis of the D/G peak ratio (0.8) indicates that the average grain size (i.e. the 3D graphene crystallite size) was 23.5 nm.

The 3D graphene layer formed by this method was found to be between 20 μm and 45 μm thick. The electrical conductivity of the 3D graphene, as determined by galvanic impedance measurements, was found to be between 10 S/cm and 100 S/cm. The 3D graphene was found to be porous with an average pore size of between 4 nm and 10 nm.

The method according to this second example embodiment of the invention has also been used to form 3D graphene on substrates consisting of (1) a thin film of cyclic olefin copolymer (COC) and (2) a thin film of poly(methylmethacrylate) (PMMA), with similar results.

Figure 12:
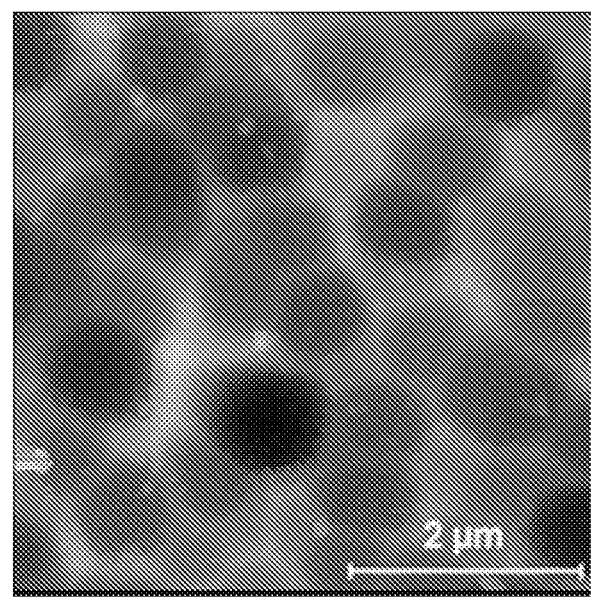
FIG. 12 shows an AFM image of a 3D graphene film deposited on a polyimide substrate.

FIG. 12 is an atomic force microscopy (AFM) image which provides an example of the finely detailed 3D graphene structures which can be deposited by this method.

3D graphene materials deposited using the method according to this first example embodiment have been doped with boron and with nitrogen using standard doping methods known in the field, including plasma doping.

Further variations and modifications may be made within the scope of the invention herein disclosed.

The invention claimed is:

1. A method of forming a 3D graphene material adhered to a substrate, the method comprising: providing a carbon source on or immediately adjacent to a surface of the substrate, the carbon source comprising carbon-containing material; and using a laser beam, wherein the substrate is substantially transparent to the laser beam, and the laser beam is transmitted through the substrate to an interface between the substrate and the carbon source, wherein the laser beam is absorbed and heats the carbon source locally, to convert at least a portion of the carbon source into a 3D graphene material adhered to the substrate via an interface layer formed by the laser beam, the interface layer bonding the 3D graphene material to the substrate, wherein the laser beam to which at least a portion of the carbon source and at least a portion of the substrate is exposed has power between 1.2 W and 24 W, and wherein the laser beam to which at least a portion of the carbon source and at least a portion of the substrate is exposed is a pulsed laser beam with a pulse duration in the range between 1 μs and 50 μs.

2. The method according to claim 1, wherein the carbon source is a preformed sheet comprising carbon-containing material and wherein converting at least a portion of the carbon source into the 3D graphene material adhered to the substrate comprises transferring carbon from the preformed sheet to the surface of the substrate and forming a 3D graphene material adhered to the substrate.

3. The method according to claim 1 further comprising removing one or more unconverted portions of the carbon source which have not converted to the 3D graphene material from the surface of the substrate.

4. The method according to claim 1, wherein the carbon source comprises one or more polymers.

5. The method according to claim 1, wherein the substrate comprises one or more of the following: silicon, silicon dioxide, gallium nitride, gallium arsenide, zinc oxide.

6. The method according to claim 1, wherein the substrate comprises one or more polymers.

7. The method according to claim 1 further comprising introducing one or more dopants into the 3D graphene material formed and adhered to the substrate.

8. The method according to claim 1, wherein the method is carried out at atmospheric pressure and at room temperature.

9. The method according to claim 1, wherein the method includes a step of manufacturing one or more device components.

10. The method according to claim 1, wherein the method includes a step of manufacturing one or more device components, including using the 3D graphene material adhered to the substrate.

11. The method according to claim 1, wherein forming the 3D graphene material adhered to the substrate comprises concurrently transferring carbon from the carbon source to the surface of the substrate, forming the 3D graphene material, and adhering the 3D graphene material to the substrate.

12. The method according to claim 1, wherein before exposure to the laser beam, the carbon source is not adhered to surface of the substrate.

13. The method according to claim 1, wherein the carbon-containing material comprises at least 50% carbon by mass.

14. The method according to claim 1, wherein the carbon-containing material comprises at least 75% carbon by mass.

15. The method according to claim 1, wherein the carbon-containing material comprises at least 90% carbon by mass.

16. The method according to claim 1, wherein the carbon source comprises a flexible sheet.

17. The method according to claim 1, wherein the carbon source comprises one or more of the following materials: polyimides, polyetherimides (PEI), poly(methyl methacrylate) (PMMA), polyurethanes (PU), polyesters, vinyl polymers, carbonized polymers, photoresist polymers, alkyds, urea-formaldehyde.

18. The method according to claim 1, wherein the carbon source comprises one or more of the following materials: poly(amic acids), polyamic acid, dianhydrides, derivatives of poly(amic acids), derivatives of dianhydrides.

19. The method according to claim 1, wherein the carbon source comprises one or more of the following materials: aromatic materials; heteroaromatic materials; polymers containing aromatic moieties; cyclic materials; heterocyclic materials; heteroaromatic materials.

20. The method according to claim 1, wherein the carbon source is heated by the laser beam to a temperature between 500° C. and 2000° C.

21. The method according to claim 1, wherein the carbon source is heated by the laser beam to a temperature between 800° C. and 1030° C.

22. The method according to claim 1, wherein the carbon source comprises a sheet with a thickness between 5 μm and 120 μm.

23. The method according to claim 1, wherein the carbon source comprises a polyimide sheet.

24. The method according to claim 1, wherein the laser beam is an infra red laser beam.

25. The method according to claim 24, wherein the laser beam is a $CO_2$ laser beam.

26. The method according to claim 24, wherein the laser beam includes a wavelength of 10.6 μm.

27. The method according to claim 1, wherein the laser beam includes a wavelength in the range 235 nm to 27 μm.

28. The method according to claim 1, wherein the substrate is a flexible substrate.

29. The method according to claim 1, wherein the laser beam to which at least a portion of the carbon source and/or at least a portion of the substrate is exposed has a FWHM (full width at half maximum) beam width between 1 μm and 100 μm.

30. The method according to claim 1, wherein the 3D graphene material adhered to the substrate is between 5 μm and 20 μm in thickness.

31. The method according to claim 1, wherein the 3D graphene material adhered to the substrate is between 20 μm and 45 μm in thickness.

32. The method according to claim 1, wherein the carbon source comprises a polyimide film, wherein the 3D graphene formed does not extend through the full thickness of the polyimide film.

33. The method according to claim 1, wherein the carbon source comprises a polyimide film, wherein the laser beam is a $CO_2$ laser beam, wherein the laser beam to which at least a portion of the carbon source and/or at least a portion of the substrate is exposed has a FWHM (full width at half maximum) beam width between 1 μm and 100 μm.

34. The method according to claim 1, in which vacuum conditions are not used.

35. A method of forming a 3D graphene material adhered to a substrate, the method comprising: providing a carbon source on or immediately adjacent to a surface of the substrate, the carbon source comprising carbon-containing material; and exposing at least a portion of the carbon source and/or at least a portion of the substrate to a laser beam, to convert at least a portion of the carbon source into a 3D graphene material adhered to the substrate via an interface layer formed by the laser beam, the interface layer bonding the 3D graphene material to the substrate, wherein the laser beam to which at least a portion of the carbon source and/or at least a portion of the substrate is exposed has power between 1.2 W and 24 W, and wherein the laser beam to which at least a portion of the carbon source and/or at least a portion of the substrate is exposed is a pulsed laser beam with a pulse duration in the range between 1 μs and 50 μs;

wherein the substrate absorbs greater than 60% of incident light from the laser beam at the wavelength or wavelengths of the laser beam, and the substrate comprises one or more materials having thermal conductivities of at least 10 W/mK.

36. The method according to claim 35, wherein the substrate is not substantially transparent to the laser beam.

37. The method according to claim 35, in which vacuum conditions are not used.

38. The method according to claim 35, wherein the substrate comprises one or more of the following: silicon, silicon dioxide, gallium nitride, gallium arsenide, zinc oxide.

* * * * *